(12) United States Patent
He

(10) Patent No.: US 10,643,871 B2
(45) Date of Patent: May 5, 2020

(54) TRANSFER HEAD, TRANSFER HEAD ARRAY, AND METHOD FOR TRANSFERING INORGANIC LIGHT-EMITTING DIODE

(71) Applicant: Shanghai Tianma Micro-Electronics Co., Ltd., Shanghai (CN)

(72) Inventor: Zeshang He, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/174,800

(22) Filed: Oct. 30, 2018

(65) Prior Publication Data

US 2020/0043760 A1 Feb. 6, 2020

(30) Foreign Application Priority Data

Aug. 2, 2018 (CN) .......................... 2018 1 0873301

(51) Int. Cl.
*H01L 21/00* (2006.01)
*H01L 21/67* (2006.01)
*H01L 33/62* (2010.01)
*H01L 33/00* (2010.01)
*H01L 25/075* (2006.01)

(52) U.S. Cl.
CPC .... *H01L 21/67144* (2013.01); *H01L 25/0753* (2013.01); *H01L 33/0079* (2013.01); *H01L 33/62* (2013.01); *H01L 2933/0066* (2013.01)

(58) Field of Classification Search
CPC ........... H01L 21/67144; H01L 25/0753; H01L 33/0079; H01L 33/62
See application file for complete search history.

(56) References Cited

U.S. PATENT DOCUMENTS

| 8,415,771 | B1 * | 4/2013 | Golda | ..................... H01L 24/75 |
| | | | | 257/621 |
| 10,026,757 | B1 * | 7/2018 | Chang | ................. H01L 27/1248 |
| 2016/0351548 | A1 * | 12/2016 | Chen | ....................... H01L 22/20 |

FOREIGN PATENT DOCUMENTS

CN 106395736 A 2/2017

* cited by examiner

*Primary Examiner* — Richard A Booth
(74) *Attorney, Agent, or Firm* — Anova Law Group PLLC

(57) ABSTRACT

A transfer head, a transfer head array, and a method for transferring an inorganic light-emitting diode are provided. The transfer head for transferring an inorganic light-emitting diode includes a first groove and a second groove. The first groove and the second groove are arranged sequentially in a first direction, and are connected to each other. The first groove is configured to provide an inlet and an outlet for the inorganic light-emitting diode to enter and exit the transfer head. After the inorganic light-emitting diode enters the second groove through the first groove, at least a partial structure of the inorganic light-emitting diode is confined in the second groove. Picking up and transferring the inorganic light-emitting diode is realized by the transfer head with a simple structure.

13 Claims, 19 Drawing Sheets

TRANSFER HEAD, TRANSFER HEAD ARRAY, AND METHOD FOR TRANSFERRING INORGANIC LIGHT-EMITTING DIODE

CROSS-REFERENCES TO RELATED APPLICATION

This application claims the priority of Chinese Patent Application No. 201810873301.3, filed on Aug. 2, 2018, the content of which is incorporated herein by reference in its entirety.

TECHNICAL FIELD

The present disclosure generally relates to the field of display technology and, more particularly, relates to a transfer head, a transfer head array, and a method for transferring inorganic light-emitting diodes.

BACKGROUND

Conventional inorganic light-emitting diodes (ILEDs) are usually used as backlight sources in backlight modules of liquid crystal display devices. As display technologies and ILED technologies develop, ILEDs are used as pixels in high-resolution display panels, to realize ILED display panels.

When forming the ILED display panels, the ILEDS are grown on a growth substrate, and then the ILEDs are transferred to an array substrate. Currently, a transfer head is used to pick up the ILEDs and then transfer the ILEDs to the array substrate. The transfer head uses a static electrical force, a Van der Waals force, or a magnetic force, to pick up and transfer the ILEDs. The transfer head has a complex structure, and a process for forming the transfer head is complicated. The transfer head is easy to be broken. A process for picking up/transferring the ILEDs has a low success rate.

Thus, there is a need to provide a transfer head with a simple structure to solve problems in current display technologies.

The disclosed transfer head, an array of the transfer head, and a method for transferring inorganic light-emitting diodes are directed to solve one or more problems set forth above and other problems.

SUMMARY

One aspect of the present disclosure provides a transfer head for transferring ILEDs. The transfer head for transferring an inorganic light-emitting diode includes a first groove and a second groove. The first groove and the second groove are arranged sequentially in a first direction, and are connected to each other. The first groove is configured to provide an inlet and an outlet for the inorganic light-emitting diode to enter/exit the transfer head. After the inorganic light-emitting diode enters the second groove through the first groove, at least a partial structure of the inorganic light-emitting diode is confined in the second groove. Picking up and transferring the inorganic light-emitting diode is realized by a transfer head with a simple structure.

Another aspect of the present disclosure provides a transfer head array. The transfer head array includes a plurality of transfer heads provided by various embodiments of the present disclosure arranged in an array.

Another aspect of the present disclosure provides a method for transferring inorganic light-emitting diodes. The method includes: providing a first substrate including a plurality of inorganic light-emitting diodes; providing a transfer head including a first groove and a second groove, where the first groove is configured to provide an inlet and an outlet for one of the plurality of inorganic light-emitting diodes to enter/exit the transfer head and the second groove is configured to confine at least a partial structure of the one of the plurality of inorganic light-emitting diodes in the transfer head; pushing down the transfer head to move the one of the plurality of inorganic light-emitting diodes into the transfer head through the first groove; moving the transfer head to move the one of the plurality of inorganic light-emitting diodes into the second groove through the first groove; and lifting up the transfer head to separate one of the plurality of inorganic light-emitting diodes from the first substrate.

Another aspect of the present disclosure provides another method for transferring inorganic light-emitting diodes. The method includes: providing a second substrate which is used to accommodate a plurality of inorganic light-emitting diodes; fixing one of the plurality of inorganic light-emitting diodes in a second groove of a transfer head on the second substrate, where the second groove is configured to confine at least a partial structure of the one of the plurality of inorganic light-emitting diodes in the transfer head; moving the transfer head to move the one of the plurality of inorganic light-emitting diodes from the second groove to a first groove of the transfer head, wherein the first groove is configured to provide an inlet and an outlet for the one of plurality of the inorganic light-emitting diodes to enter and exit the transfer head; and lifting up the transfer head to release the one of the plurality of inorganic light-emitting diodes from the transfer head through the first groove.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
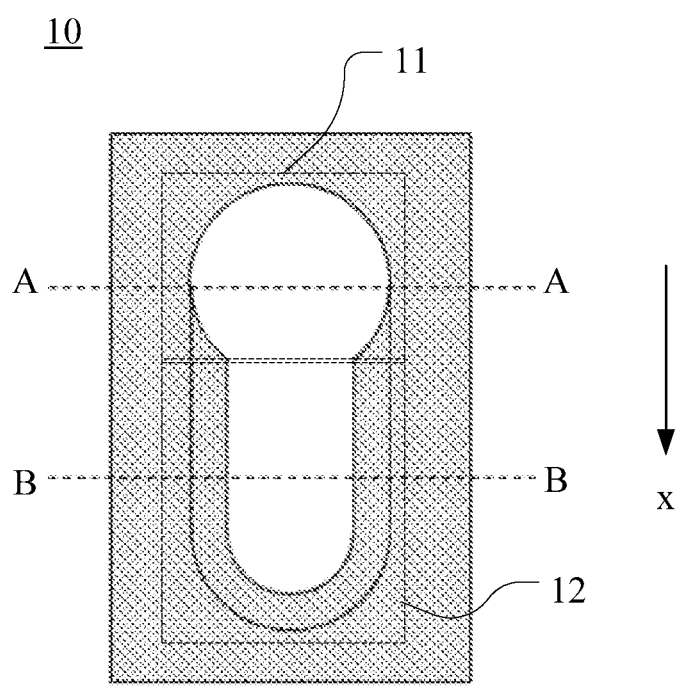
FIG. 1 illustrates an exemplary transfer head consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the invention. Furthermore, a three-dimensional (3D) size including length, width and depth should be considered during practical fabrication.

Figure 2:
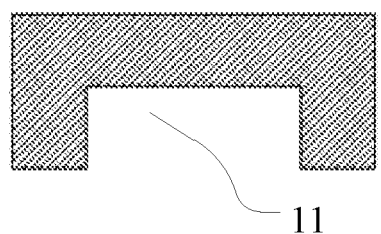
FIG. 2 illustrates a cross-section view of the transfer head in FIG. 1 along an A-A direction, consistent with various disclosed embodiments in the present disclosure.
Figure 3:
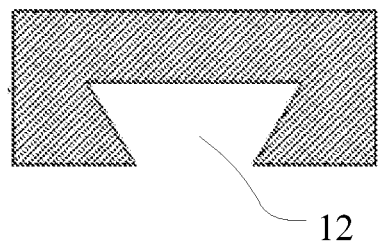
FIG. 3 illustrates a cross-section view of the transfer head in FIG. 1 along a B-B direction, consistent with various disclosed embodiments in the present disclosure.

The present disclosure provides a transfer head for transferring inorganic light-emitting diodes. The transfer head may transfer an inorganic light-emitting diode from a growth substrate to an array substrate of a display panel. FIG. 1 illustrates a structure of an exemplary transfer head consistent with various embodiments of the present disclosure, while FIG. 2 illustrates a cross-section view of the transfer head in FIG. 1 along an A-A direction and FIG. 3 illustrates a cross-section view of the transfer head in FIG. 1 along a B-B direction. The transfer head 10 may include a first groove 11 and a second groove 12. The first groove 11 and the second groove 12 may be arranged sequentially along a first direction x, and may be connected to each other. The first groove 11 and the second groove 12 together may form a through groove in the transfer head 10. In various embodiments, the first direction x may be along a line or along a curve, as long as the first groove 11 and the second groove 12 are arranged sequentially along the first direction x and are connected to each other. Subsequently, the inorganic light-emitting diode to be transferred may move from the first groove 11 to the second groove 12, or from the second groove 12 to the first groove 11, along a through direction between the first groove 11 and the second groove 12 connected to each other.

Figure 4:
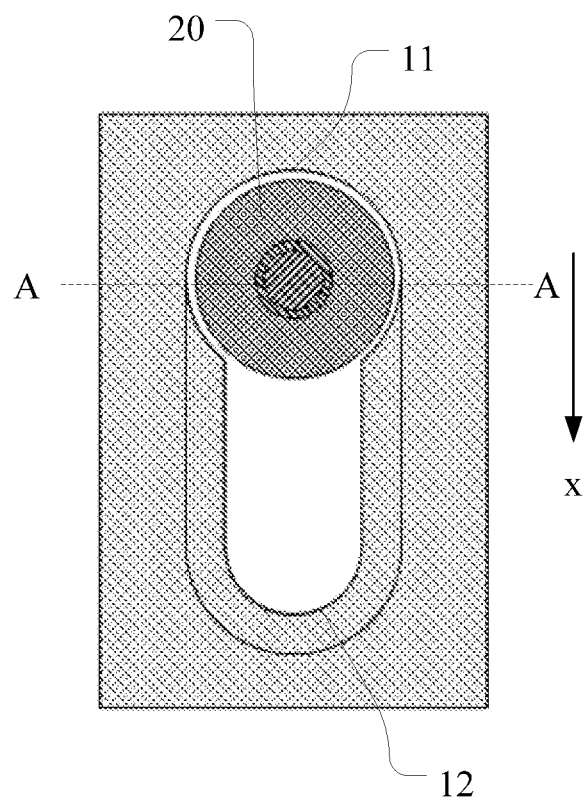
FIG. 4 illustrates a structure of an exemplary transfer head whose first groove holds an inorganic light-emitting diode, consistent with various disclosed embodiments in the present disclosure.
Figure 5:
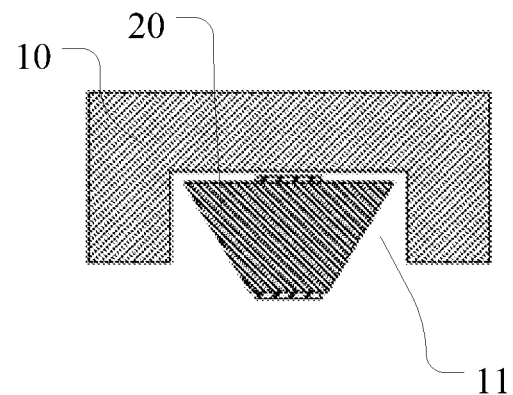
FIG. 5 illustrates a cross-section view of the transfer head in FIG. 4 along an A-A direction.

FIG. 4 illustrates a structure of an exemplary transfer head whose first groove holds an inorganic light-emitting diode, consistent with various disclosed embodiments in the present disclosure; and FIG. 5 illustrates a cross-section view of the transfer head in FIG. 4 along an A-A direction. The first groove 11 may be configured to provide an inlet/outlet for the inorganic light-emitting diode 20 to enter and exit the transfer head 10. In one embodiment, a notch of the first groove 11 may be slightly larger than the inorganic light-emitting diode 20 to be transferred, and an inner space of the first groove 11 can accommodate the inorganic light-emitting diode 20 to be transferred. Subsequently, the inorganic light-emitting diode 20 to be transferred may enter the transfer head 10 to reside in the first groove 11 through the notch of the first groove 11, and may exit the transfer head 10 through the notch of the first groove 11. Since the first groove 11 and the second groove 12 may be arranged sequentially along the first direction x and may be connected to each other, the inorganic light-emitting diode 20 to be transferred may enter the second groove 12 through the first groove 11.

Figure 6:
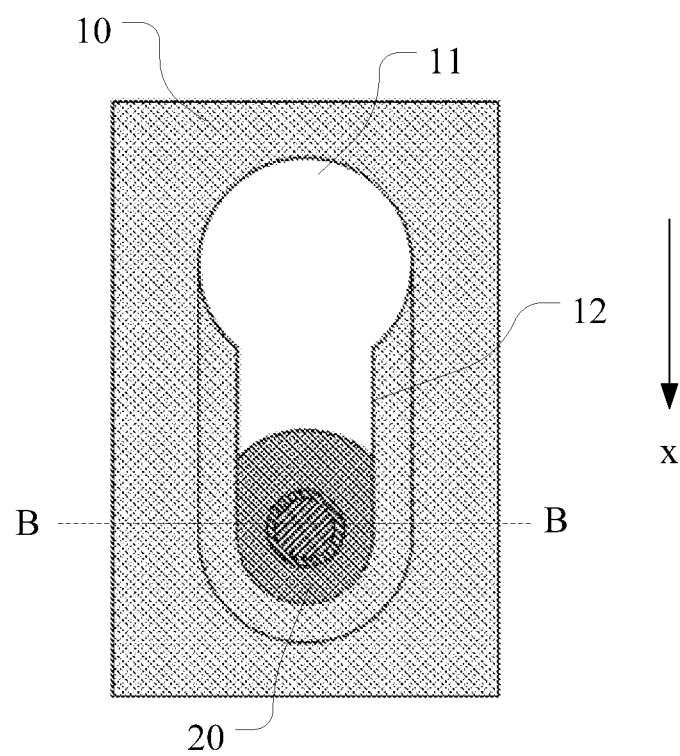
FIG. 6 illustrates a structure of an exemplary transfer head whose second groove holds an inorganic light-emitting diode, consistent with various disclosed embodiments in the present disclosure.
Figure 7:
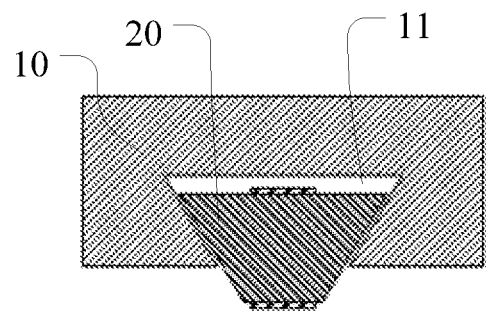
FIG. 7 illustrates a cross-section view of the transfer head in FIG. 6 along a B-B direction.

FIG. 6 illustrates a structure of an exemplary transfer head whose second groove holds an inorganic light-emitting diode, consistent with various disclosed embodiments in the present disclosure; and FIG. 7 illustrates a cross-section view of the transfer head in FIG. 6 along a B-B' direction. After the inorganic light-emitting diode 20 enters the second groove 12, at least a partial structure of the inorganic light-emitting diode 20 may be confined in the transfer head 10 by the second groove 12. In various embodiments, the inorganic light-emitting diode 20 may be confined in the second groove 12 through a match between a shape, a size, and/or a structure of the second groove 12 and of the inorganic light-emitting diode 20, so the inorganic light-emitting diode 20 cannot exit the transfer head through the second groove 12.

Figure 8:
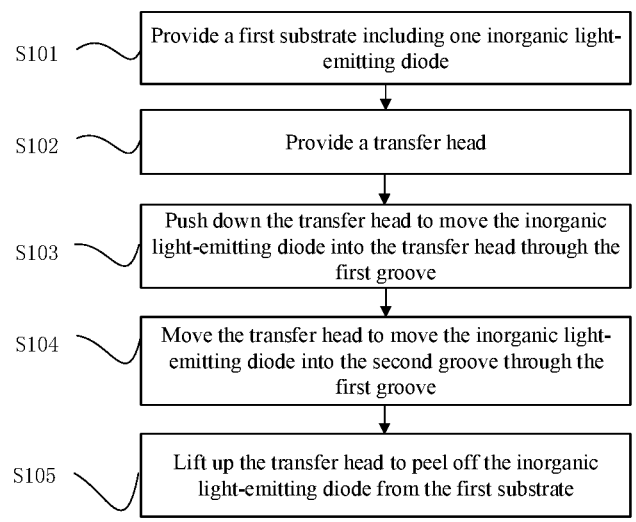
FIG. 8 illustrates a flowchart for an exemplary method for transferring an inorganic light-emitting diode consistent with various disclosed embodiments in the present disclosure.
Figure 9:
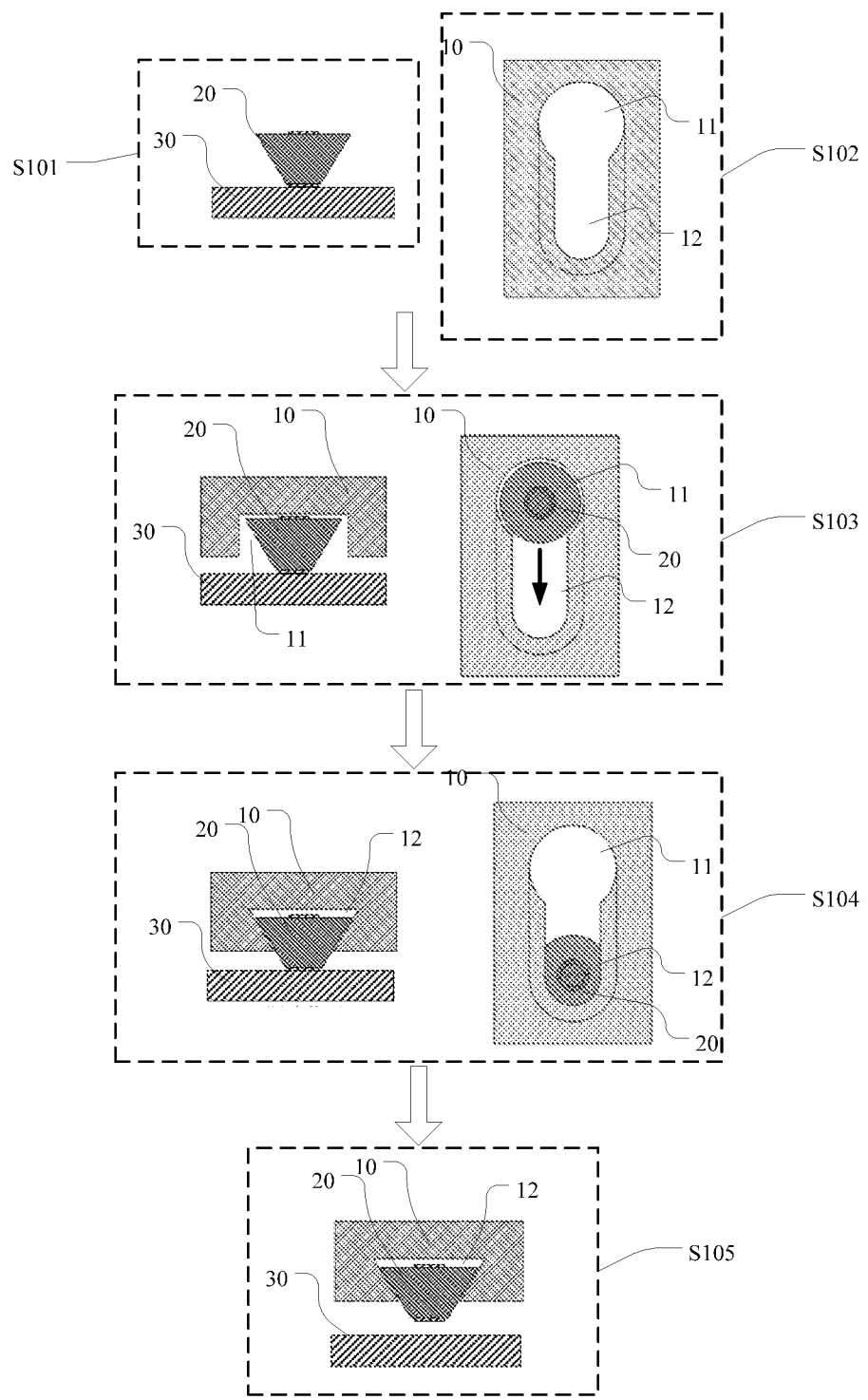
FIG. 9 illustrates structures of an exemplary transfer head corresponding to different steps for an exemplary method for transferring an inorganic light-emitting diode consistent with various disclosed embodiments in the present disclosure.

The inorganic light-emitting diode 20 may be picked up using the transfer head 10 consistent with various embodiments of the present disclosure. FIG. 8 illustrates a flowchart for a method for transferring an inorganic light-emitting diode consistent with various disclosed embodiments in the present disclosure, and FIG. 9 illustrates structures of the transfer head corresponding to different steps for the method in FIG. 8. The method for transferring the inorganic light-emitting diode 20 may include Steps S101 to S105 in FIG. 8 described in detail below.

Step S101: providing a first substrate 30.

The first substrate 30 may include inorganic light-emitting diodes 20. The inorganic light-emitting diodes 20 may be arranged in an array in the first substrate 30. For illustration purposes only, FIG. 9 uses a first substrate 30 with one inorganic light-emitting diode 20 as an example, and should not limit the scope of the present disclosure. The first substrate 30 may include any number of the inorganic light-emitting diodes. In one embodiment, the first substrate 30 may be used as the growth substrate of the inorganic light-emitting diodes 20. For example, a wafer for inorganic light-emitting diodes 20 may be formed by growing different film layers for the inorganic light-emitting diodes 20 firstly and then the wafer may be cut to a plurality of crystallites to form inorganic light-emitting diodes 20.

Step S102: the transfer head 10 may be provided.

The transfer head 10 may be provided by any embodiments of the present disclosure and can be referred to the previous description.

Step 103: the transfer head 10 may be pushed down, to make the inorganic light-emitting diode 20 on the first substrate 30 entering the transfer head 10 through the first groove 11.

In this step, firstly, a side of the transfer head 10 including the notch of the first groove 11 may be faced with the first substrate 30, and the notch of the first groove 11 may be aligned with the inorganic light-emitting diode 20 on the first substrate 30. Then the transfer head 10 may be pushed down, to make the inorganic light-emitting diode 20 on the first substrate 30 entering the transfer head 10 through the first groove 11.

Step 104: the transfer head 10 may be moved, to make the inorganic light-emitting diode 20 moving from the first groove 11 to the second groove 12.

In this step, the transfer head 10 may be moved in the connecting direction between the first groove 11 and the second groove 12, to make the inorganic light-emitting diode 20 moving from the first groove 11 to the second groove 12. After the inorganic light-emitting diode 20 enter the second groove 12, the inorganic light-emitting diode 20 may be confined in the second groove 12 and cannot exit the transfer head 10 through the second groove 12.

Step S105: the transfer head 10 may be lifted up, to separate, e.g., to peel off, the inorganic light-emitting diode 20 from the first substrate 30.

In this step, when lifting up the transfer head 10 from the first substrate 30, the inorganic light-emitting diode 20 may exit the first substrate 30 along with the transfer head 10 because the inorganic light-emitting diode 20 may be confined in the second groove 12. Subsequently, the inorganic light-emitting diode 20 may be peeled off from the first substrate 30.

Figure 10:
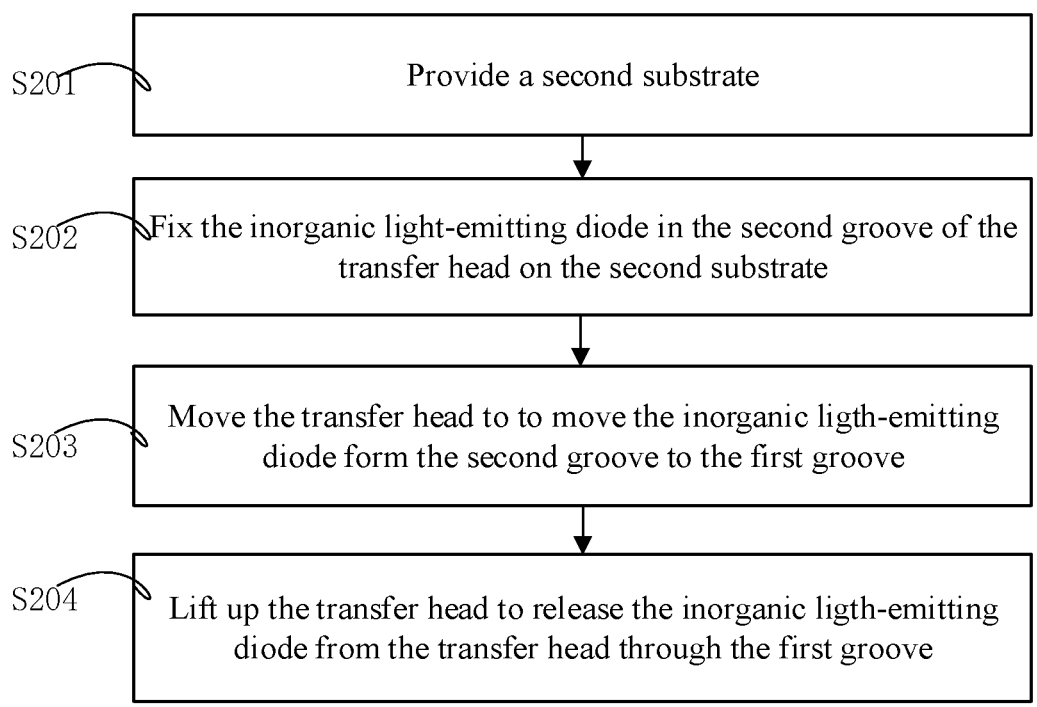
FIG. 10 illustrates a flow chart for another exemplary method for transferring an inorganic light-emitting diode consistent with various disclosed embodiments in the present disclosure.
Figure 11:
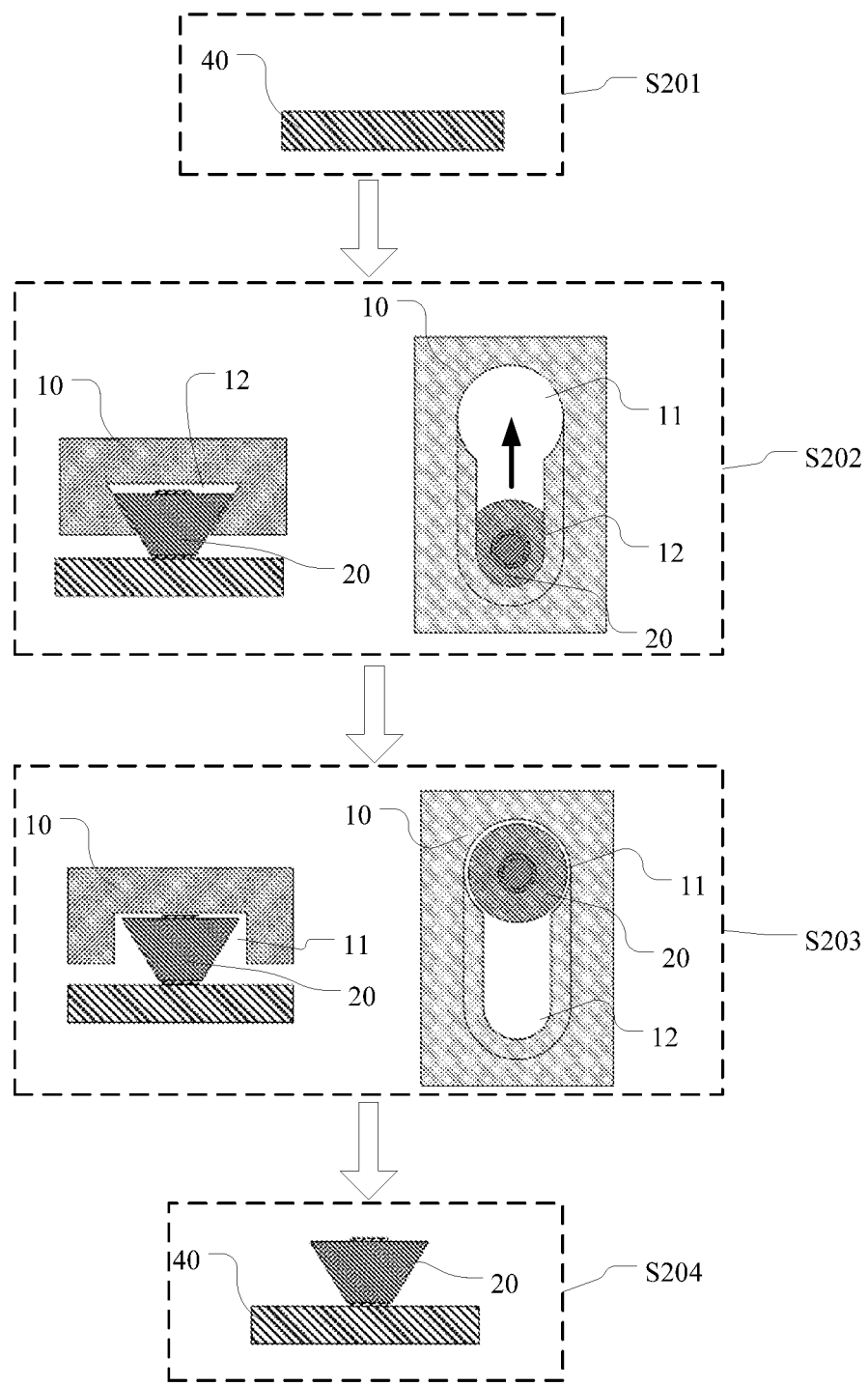
FIG. 11 illustrates structures of an exemplary transfer head corresponding to different steps for another exemplary method for transferring an inorganic light-emitting diode consistent with various disclosed embodiments in the present disclosure.

The inorganic light-emitting diode 20 may be released on an array substrate or other substrate requiring the inorganic light-emitting diode 20 using the transfer head 10 consistent with various embodiments of the present disclosure. FIG. 10 illustrates a flow chart for another method for transferring an inorganic light-emitting diode consistent with various disclosed embodiments in the present disclosure; and FIG. 11 illustrates the structures of the transfer head corresponding to different steps for the method in FIG. 10. The method for transferring the inorganic light-emitting diode 20 may include Steps S201 to S204 in FIG. 10 described in detail below.

Step S201: a second substrate 40 may be provided.

The second substrate 40 may be a substrate to accommodate inorganic light-emitting diodes. In one embodiment, the second substrate 40 may be an array substrate of the display panel. The array substrate may include a substrate, and thin film transistors and signal lines on a side of the substrate. A pixel circuit to control the inorganic light-emitting diodes may be formed by the thin film transistors and the signal lines. When forming the display panel, the inorganic light-emitting diode 20 in the transfer head may be transferred to the array substrate by the method consistent with various embodiments of the present disclosure.

Step S202: the inorganic light-emitting diode 20 in the second groove 12 of the transfer 10 may be fixed on the second substrate 40.

The transfer head 10 may have a structure described previously. The inorganic light-emitting diode 20 may be confined in the second groove 12 of the transfer head 10. Firstly, a side of the transfer head including a notch of the second groove 12 may be faced with the second substrate, and the inorganic light-emitting diode 20 in the second groove 12 may be aligned with a position in the second substrate 40 to accommodate the inorganic light-emitting diode 20. In one embodiment, in the array substrate, electrodes may be deployed on a side of the thin film transistors away from the substrate, and the position in the second substrate 40 to accommodate the inorganic light-emitting diode 20 may be a corresponding position in the electrodes. After the inorganic light-emitting diode 20 in the second groove 12 may be aligned with the corresponding position in the second substrate 40, the inorganic light-emitting diode 20 may be fixed on the second substrate 40.

Step S203: the transfer head 10 may be moved, to make the inorganic light-emitting diode 20 moving from the second groove 12 to the first groove 11.

In this step, the transfer head 10 may be moved in the connecting direction between the first groove 11 and the second groove 12, to make the inorganic light-emitting diode 20 moving from the second groove 12 to the first groove 11. After the inorganic light-emitting diode 20 enters the first groove 11, the inorganic light-emitting diode 20 may exit the transfer head through the first groove 11.

Step S204: the transfer head 10 may be lifted up so the inorganic light-emitting diode 20 may exit the transfer head through the first groove 11.

In this step, when lifting up the transfer head 10 away from the second substrate 40, the inorganic light-emitting diode 20 may exit the transfer head through the first groove 11 since the inorganic light-emitting diode 20 may be fixed on the second substrate 40. Correspondingly, the inorganic light-emitting diode 20 may be released on the second substrate 40.

A single transfer head 10 and the method for transferring a single inorganic light-emitting diode 20 are described previously. In other embodiments, an array of the transfer heads 10 including a plurality of the transfer heads 10 may be formed in a body structure, or a plurality of the transfer heads 10 may be formed in a base structure to form the array of the transfer heads, to transfer a plurality of the inorganic light-emitting diodes 20 in the same time. In various embodiments, a relative position of each transfer head 10 in the array of the transfer heads may be determined by a relative position of the inorganic light-emitting diodes 20 to be transferred in the first substrate 30 and in the second substrate 40. For example, when the inorganic light-emitting diodes 20 are arranged in an array in the first substrate 30 and in the second substrate 40, the transfer heads 10 in the array of the transfer heads may be arranged in an array accordingly.

In the transfer head and the method for transferring the inorganic light-emitting diode using the transfer head provided by various embodiments of the present disclosure, the transfer head may use a physical structure to pick up and to release the inorganic light-emitting diode, and may have a simple structure. Compared to the transfer heads using complex electrical or magnetic structures, a difficulty in the process for forming the transfer head provided by various embodiments of the present disclosure may be reduced and a cost for the transfer head may be reduced too. When transferring the inorganic light-emitting diode using the transfer head provided by the present disclosure, the transfer head may not be damaged during the transferring process, and a success rate of picking up and releasing the inorganic light-emitting diode may be improved. Moreover, using the array of the transfer heads including a plurality of the transfer heads provided by the present disclosure, a plurality of the inorganic light-emitting diodes may be transferred in the same time. A simple and reliable method for a massive transfer of the inorganic light-emitting diodes is provided.

Figure 12:
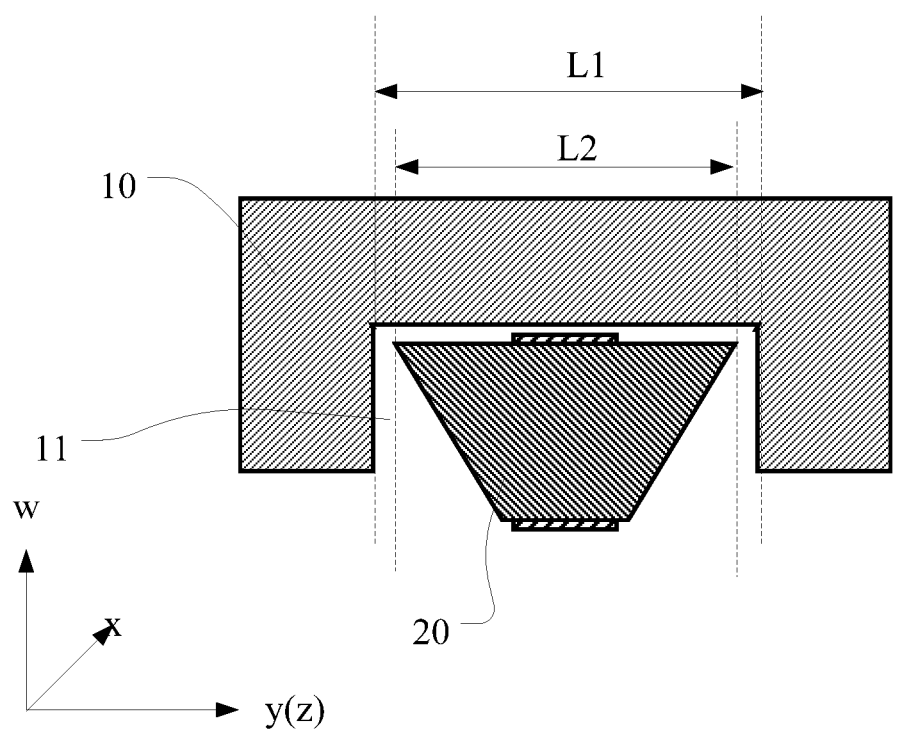
FIG. 12 illustrates a comparison between a first groove of an exemplary transfer head consistent with various disclosed embodiments in the present disclosure and an inorganic light-emitting diode.

FIG. 12 illustrates a comparison between a first groove of a transfer head consistent with various disclosed embodiments in the present disclosure and an inorganic light-emitting diode. In the first groove 11 of the transfer head 10, a minimum distance of two opposite inner sidewalls opposite to each other in a second direction y may be a first distance L1 of the first groove 11. When the sidewall of the first groove 11 is a side of a cylinder, a conical, or a roundtable, the first distance L1 of the first groove 11 may be a minimum distance through the center line of the first groove 11 in the second direction y. The second direction y may be perpendicular to the first direction x. In the inorganic light-emitting diode 20, a maximum distance of two opposite outer sidewalls opposite to each other in a third direction z may be a second distance L2 of the inorganic light-emitting diode 20. The inorganic light-emitting diode 20 may have a multilayer stacking structure, and the third direction z may be perpendicular to a stacking direction w of the multilayer stacking structure, and may lie in a plane including the first direction x and the second direction y. An angle between the second direction y and the third direction z may be any value. In one embodiment, the angle between the second direction y and the third direction z may be zero. The first distance L1 of the first groove 11 may be larger than the second distance L2 of the inorganic light-emitting diode 20. Correspondingly, in the transfer head presented by this embodiment of the present disclosure, the minimum distance of two opposite inner sidewalls opposite to each other in the second direction y of the first groove may be larger than the maximum distance of two opposite outer sidewalls opposite to each other in a third direction z of the inorganic light-emitting diode, so the inorganic light-emitting diode can enter the first groove.

Figure 13:
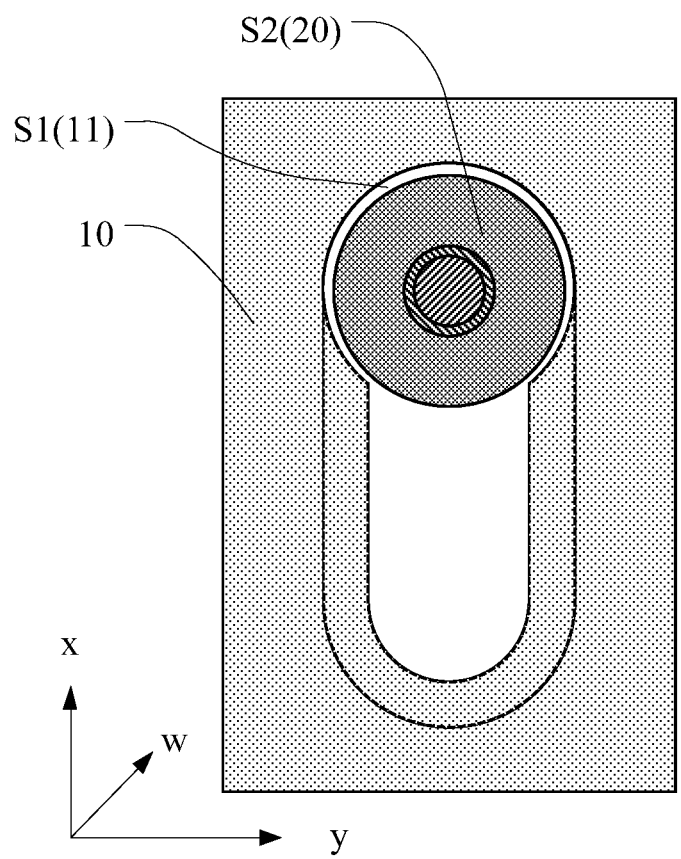
FIG. 13 illustrates a comparison between a first groove of an exemplary transfer head consistent with various disclosed embodiments in the present disclosure and an inorganic light-emitting diode.

FIG. 13 illustrates a comparison between a first groove of another transfer head consistent with various disclosed embodiments in the present disclosure and an inorganic light-emitting diode. A cross section of the first groove 11 obtained by tangentially cutting the transfer head 10 in a plane parallel to the first direction x and the second direction y may be a first cross section S1. The first cross section S1 may be parallel to both the first direction x and the second direction y. A cross-section of the inorganic light-emitting diode 20 obtained by tangentially cutting the inorganic light-emitting diode 20 in a direction perpendicular to the stacking direction w of the inorganic light-emitting diode 20 with the multi-layer stacking structure may be a second cross section S2. The first section S1 of the first groove 11 may have a shape same as the second cross section S2 of the inorganic light-emitting diode 20. Correspondingly, in the transfer head presented by this embodiment of the present disclosure, the first section S1 of the first groove 11 may have a shape same as the second cross section S2 of the inorganic light-emitting diode 20, and the inorganic light-emitting diode can enter the transfer head through the first groove. The first groove may have an inner space inside the first groove slightly larger than a volume of the inorganic light-emitting diode to be transferred, and a size of the transfer head may be reduced.

Figure 14:
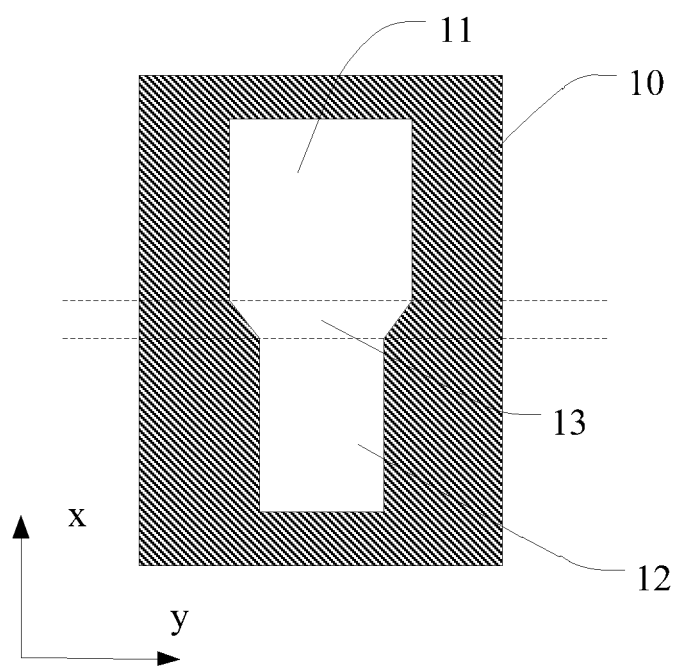
FIG. 14 illustrates a top view of an exemplary transfer head consistent with various disclosed embodiments in the present disclosure.

In various embodiments, the first cross section S1 and the second cross section S2 may both be circles, ellipses, rectangles, trapezoids, other polygons or irregular shapes. In one embodiment as illustrated in FIG. 13, the first cross section S1 and the second cross section S2 may both be circles. In another embodiment in FIG. 14 illustrating a top view of another transfer head, the first cross section S1 and the second cross section S2 may both be squares. When the first cross section S1 and the second cross section S2 both are circles or regular polygons, the inorganic light-emitting diode 20 may be easy to be aligned when the inorganic light-emitting diode 20 enters the first groove 11, to avoid a damage on the inorganic light-emitting diode 20 or avoid that the inorganic light-emitting diode 20 cannot enter the first groove 11 quickly.

When the first cross section S1 and the second cross section S2 both are squares, the notch of the second groove 12 may have a size in the second direction y smaller than the size of the notch of the first groove 11 in the second direction y. A transition groove 13 may be formed between the first groove 11 and the second groove 12. A minimum distance between two opposite inner sidewalls of the transition groove 13 along the second direction y may gradually decrease in a direction away from the first groove 11 starting at a connection position of the transition groove 13 and the first groove 11. In the transfer head provided by the embodiment, the transition groove 13 may be formed between the first groove 11 and the second groove 12. Correspondingly, the inorganic light-emitting diode may move between the first groove and the second groove more smoothly.

Figure 15:
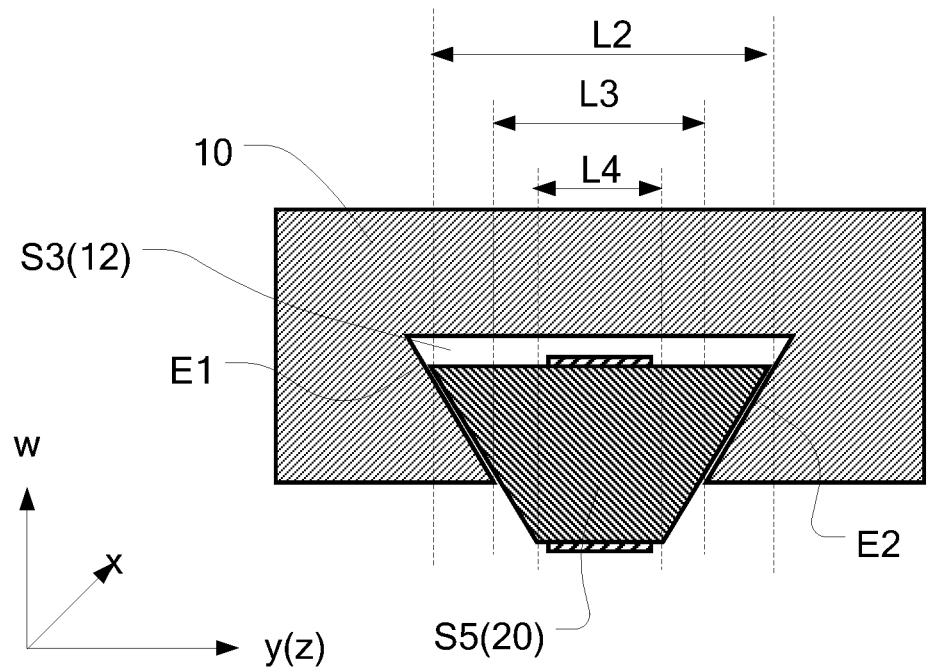
FIG. 15 illustrates a comparison between a second groove of an exemplary transfer head consistent with various disclosed embodiments in the present disclosure and an inorganic light-emitting diode.

FIG. 15 illustrates a comparison between the second groove of a transfer head and an inorganic light-emitting diode consistent with various embodiments of the present disclosure. In the second groove 12 of the transfer head 10, a minimum distance of two opposite inner sidewalls opposite to each other in the second direction y may be a third distance L3, and a distance between a position of the third distance L3 and the bottom of the second groove 12 may be larger than 0. The second direction y may be perpendicular to the first direction x. In the inorganic light-emitting diode 20, a maximum distance of two opposite outer sidewalls opposite to each other in a third direction z may be the second distance L2 of the inorganic light-emitting diode 20. The inorganic light-emitting diode 20 may have a multilayer stacking structure, and the third direction z may be perpendicular to a stacking direction w of the multilayer stacking structure, and may lie in a plane including the first direction x and the second direction y. An angle between the second direction and the third direction may be any value. In one embodiment in FIG. 15, the angle between the second direction and the third direction may be zero. The third distance L3 of the second groove 12 may be smaller than the second distance L2 of the inorganic light-emitting diode 20. Correspondingly, in the transfer head presented by this embodiment of the present disclosure, the minimum distance of two opposite inner sidewalls opposite to each other in the second direction y of the second groove may be smaller than the maximum distance of two opposite outer sidewalls opposite to each other in a third direction z of the inorganic light-emitting diode, so the inorganic light-emitting diode can be confined in the second groove.

In one embodiment illustrated in FIG. 15, a minimum distance of two opposite outer sidewalls opposite to each other in a third direction z of the inorganic light-emitting diode 20 may be a fourth distance L4. The third distance L3 of the second groove 12 may be larger than the fourth distance L4 of the inorganic light-emitting diode 20. In the transfer head provided by the present disclosure, the minimum distance of two opposite inner sidewalls opposite to each other in the second direction of the second groove may be larger than the minimum distance of two opposite outer sidewalls opposite to each other in the third direction of the inorganic light-emitting diode. When the inorganic light-emitting diode enters the second groove, the inorganic light-emitting diode may be confined in the second groove while a portion of the inorganic light-emitting diode may protrude from the second groove. The portion of the inorganic light-emitting diode protruding from the second groove may be fixed on the second substrate the inorganic light-emitting diode is released. Correspondingly, when moving the inorganic light-emitting diode out from the first groove, the inorganic light-emitting diode may not be moved along with the transfer head, be tilted/damaged, or be moved to another position. An occurrence of that the inorganic light-emitting diode cannot be transferred to the second substrate normally may be avoided.

Figure 16:
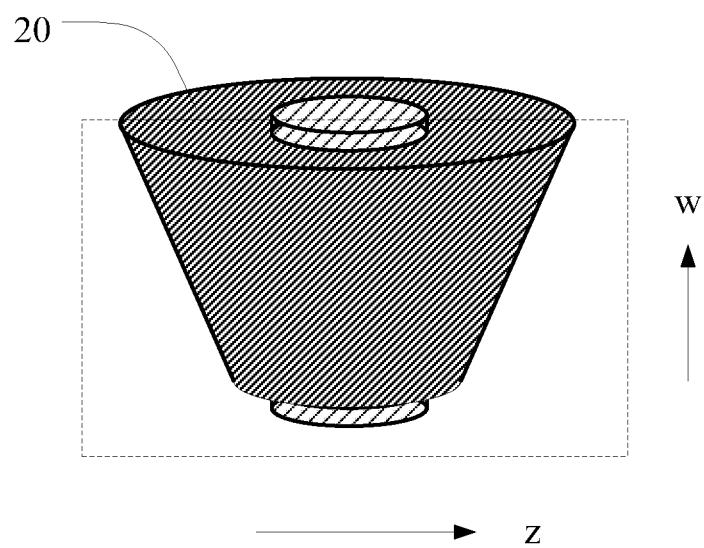
FIG. 16 illustrates a structure of an exemplary inorganic light-emitting diode consistent with various disclosed embodiments in the present disclosure.

FIG. 16 illustrates a structure of an inorganic light-emitting diode consistent with various embodiments of the present disclosure. The inorganic light-emitting diode 20 to be transferred may have a shape of a roundtable. One end of the inorganic light-emitting diode 20 may be larger than another end of the inorganic light-emitting diode 20, and a size of the inorganic light-emitting diode 20 may decrease gradually from the larger end to the smaller end. A cross-section of the inorganic light-emitting diode 20 along a plane formed by the stacking direction w and the third direction z may be a fifth cross section S5 illustrated in FIG. 15. The fifth cross section S5 may be a trapezoid with a long side and a short side which are opposite and parallel to each other. When the inorganic light-emitting diode 20 enters the transfer head 10, a side of the inorganic light-emitting diode 20 corresponding to the long side of the trapezoid, i.e., the larger end of the inorganic light-emitting diode 20, may be close to a bottom of the first groove 11 and of the second groove 12 in the transfer head 10; while a side of the inorganic light-emitting diode 20 corresponding to the short side of the trapezoid, i.e., the smaller end of the inorganic light-emitting diode 20, may be close to the notch of the first groove 11 and of the second groove 12 in the transfer head 10.

In one embodiment, when transferring the inorganic light-emitting diode 20 illustrated in FIG. 16, a cross section of the second groove 12 in the transfer head 10 along a plane perpendicular to the first direction x may be a third cross section S3. The third cross section S3 may have a quadrilateral structure, and may have a first side E1 and a second side E2 opposite to each other along the second direction y. A distance between the first side E1 and the second side E2 may decrease gradually from the bottom of the groove to the notch of the groove, which is consistent with a change of the inorganic light-emitting diode from a portion on the bottom of the groove to another portion at the notch of the groove. Correspondingly, the inorganic light-emitting diode 20 can slide in the second groove 12 along the first direction x but can be confined by the second groove 12. In various embodiments, the first side E1 and the second side E2 may be straight lines or arcs. In one embodiment, the third cross section S3 may be a trapezoid same as a shape of the fifth cross section S5 of the inorganic light-emitting diode 20. A long side of the trapezoid may correspond to the bottom of the second groove 12. Correspondingly, a small inner space in the second groove 12 may be needed to make the inorganic light-emitting diode 20 moving smoothly in the second groove 12 along the first direction x. The size of the transfer head 10 may be reduced.

Figure 17:
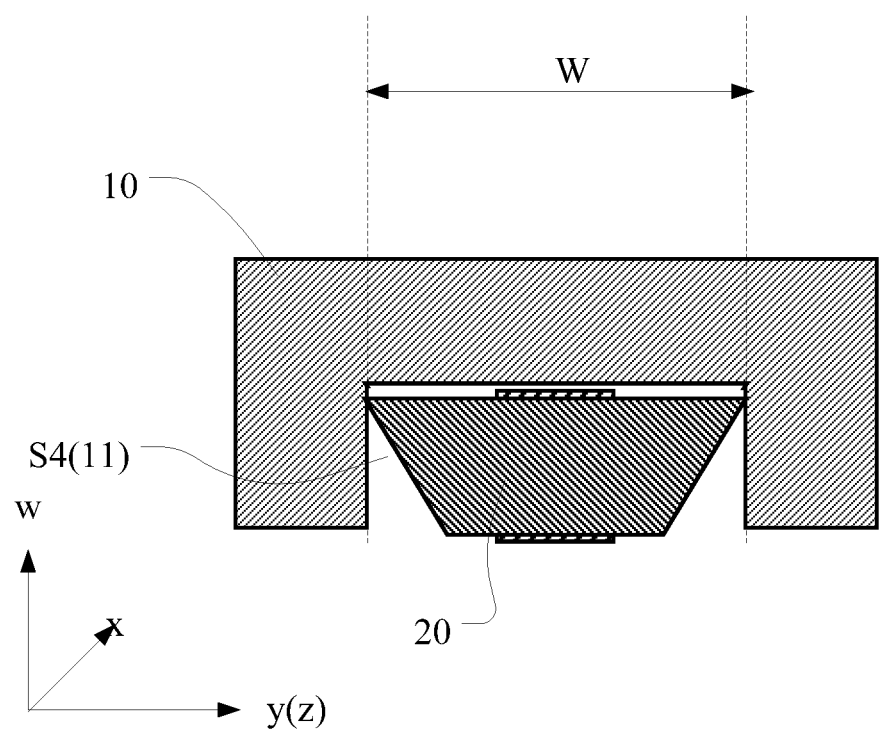
FIG. 17 illustrates a first groove of an exemplary transfer head having a structure for accommodating an inorganic light-emitting diode consistent with various disclosed embodiments in the present disclosure.

FIG. 17 illustrates a first groove of another transfer head having a structure for accommodating an inorganic light-emitting diode consistent with various embodiments of the present disclosure. A cross section of the first groove 11 in the transfer head 10 along a plane perpendicular to the first direction x may be a fourth cross section S4. The fourth cross section S4 may be a rectangle, and may have a width W along the second direction y same as the long side of the third cross section S3 of the second groove 12. Correspondingly, when the inorganic light-emitting diode 20 can enter the first groove, it can enter the second groove 12 also. The width W of the fourth cross section S4 along the second direction y may be larger than the long side of the cross-sectional trapezoid of the inorganic light-emitting diode 20, so the inorganic light-emitting diode 20 may enter the first groove 11 smoothly. In the transfer head provided by this embodiment, the fourth cross section S4 of the first groove 11 may be a rectangle, so the first groove may be formed by a simple process. Further, the cross-sectional rectangle of the first groove may have a width same as the long side of the cross-sectional trapezoid of the second groove, so the inorganic light-emitting diode may just enter the first groove.

Figure 18:
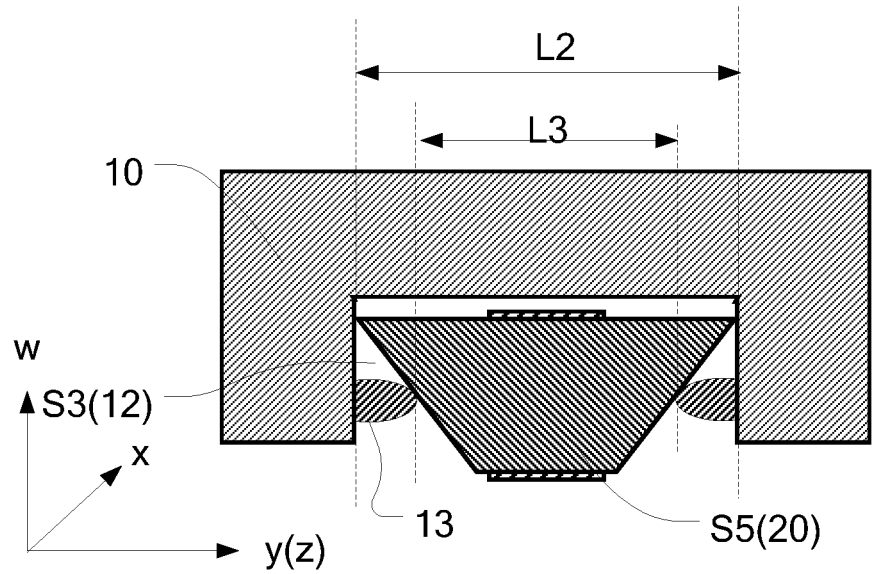
FIG. 18 illustrates a second groove of an exemplary transfer head having a structure for accommodating an inorganic light-emitting diode consistent with various disclosed embodiments in the present disclosure.
Figure 19:
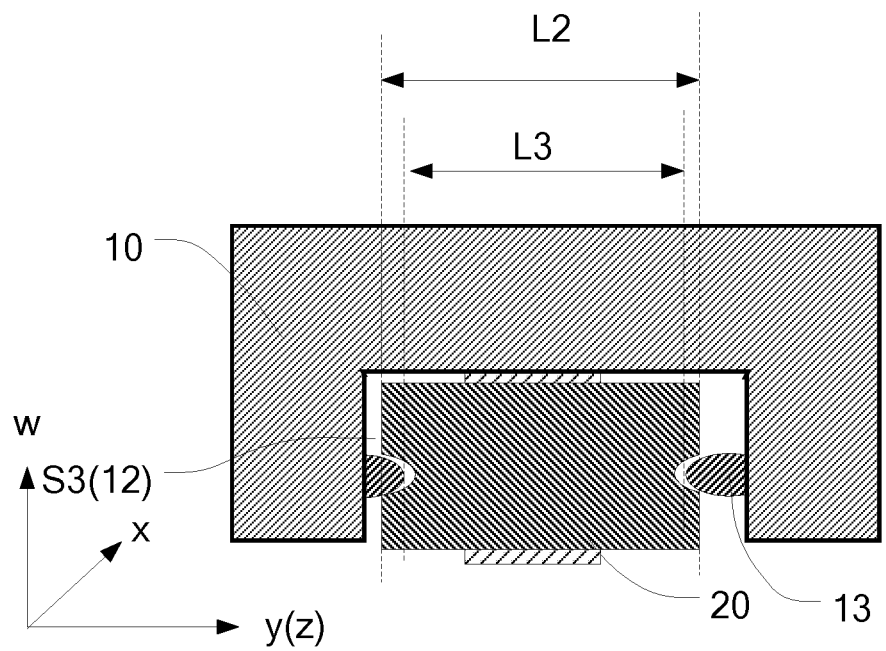
FIG. 19 illustrates a second groove of another exemplary transfer head consistent with various disclosed embodiments in the present disclosure and an inorganic light-emitting diode.

FIG. 18 illustrates a second groove of another transfer head having a structure for accommodating an inorganic light-emitting diode consistent with various disclosed embodiments in the present disclosure; and FIG. 19 illustrates a second groove of another transfer head having a structure for accommodating an inorganic light-emitting diode consistent with various disclosed embodiments in the present disclosure. A cross section of the second groove 12 in the transfer head 10 along a plane perpendicular to the first direction x may be the third cross section S3. The third cross section S3 may be a rectangle. The second groove 12 may include protrusions 13 on two opposite inner sidewalls opposite to each other along the second direction y respectively. A distance between two protrusions 13 may be a minimum distance of the second groove 12 along the second direction y, i.e., the third distance L3. In the transfer head provided by this embodiment, the third cross section S3 of the second groove may be a rectangle, so the second groove may be formed by a simple process. Further, two protrusions on the inner sidewalls of the second groove may be used to confine the inorganic light-emitting diode.

In one embodiment illustrated in FIG. 18, the transfer head 10 may be used to transfer the inorganic light-emitting diode 20 with a fifth cross section S5 of a trapezoid. Two protrusions 13 on the inner sidewalls of the second groove 12 may limit the outer sidewalls of the inorganic light-emitting diode 20, and then confine the inorganic light-emitting diode 20. In one embodiment illustrated in FIG. 19, the transfer head 10 may be used to transfer the inorganic light-emitting diode 20 with a fifth cross section S5 of a rectangle. Grooves may be formed in the outer sidewalls of the inorganic light-emitting diode 20. Two protrusions 13 on the inner sidewalls of the second groove 12 may match the grooves in the outer sidewalls of the inorganic light-emitting diode 20, to confine inorganic light-emitting diode 20.

In one embodiment, a distance between two protrusions 13 on the inner sidewalls of the second groove 12 may be adjustable. For example, through holes may be formed in the inner sidewalls of the second groove 12, and movable blocks may enter the second groove 12 via the through holes to form protrusions 13 on the inner sidewalls of the second groove 12. An end of each movable block may be equipped with a fixing device. When the movable block enters the second groove 12 via the corresponding through hole and arrives at an appropriate position to set the distance between two protrusions 13 on the inner sidewalls of the second groove 12 an appropriate value, the fixing device may fix the movable block. In the transfer head provided by this embodiment, the transfer head may transfer the inorganic light-emitting diodes with different sizes or shapes, since the distance between two protrusions 13 on the inner sidewalls of the second groove 12 may be adjustable.

Figure 20:
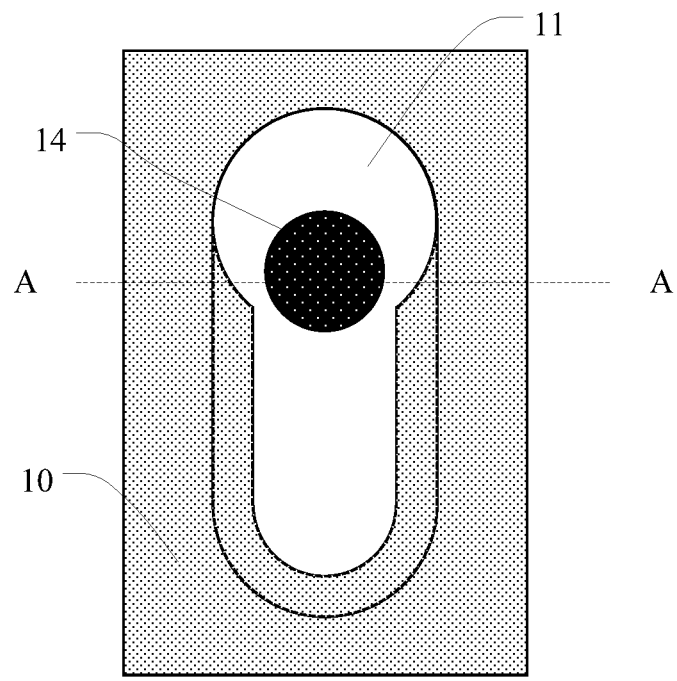
FIG. 20 illustrates a structure of an exemplary transfer head consistent with various disclosed embodiments in the present disclosure.
Figure 21:
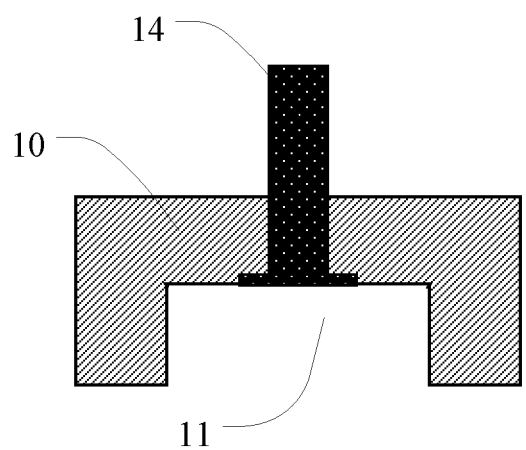
FIG. 21 illustrates a cross-section view of the transfer head in FIG. 20 along an A-A direction, consistent with various disclosed embodiments in the present disclosure.

FIG. 20 illustrates a structure of another transfer head consistent with various disclosed embodiments in the present disclosure; and FIG. 21 illustrates a cross-section view of the transfer head in FIG. 20 along an A-A direction. A first through hole may be formed on the bottom of the first groove on a side of the first groove 11 close to the second groove 12. The transfer head 10 may further include a first fixing block 14. The first fixing block 14 may enter the first groove 11 via the first through hole and may move along a depth direction of the first groove 11. In the transfer head provided by this embodiment, the first fixing block can move along a depth direction of the first groove. When the inorganic light-emitting diode to be transferred enters the second groove of the transfer head, the first fixing block may enter the first groove, so the inorganic light-emitting diode cannot move from the second groove to the first groove.

Figure 22:
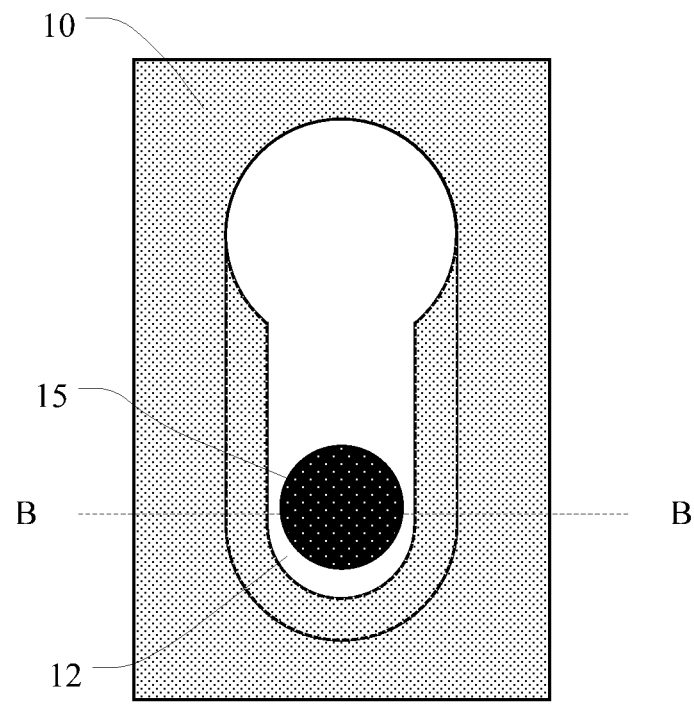
FIG. 22 illustrates a structure of an exemplary transfer head consistent with various disclosed embodiments in the present disclosure.
Figure 23:
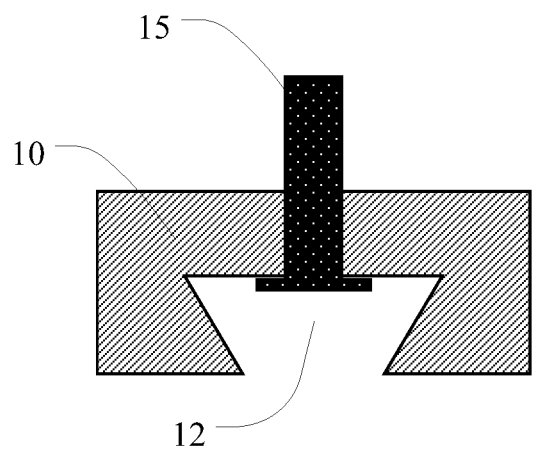
FIG. 23 illustrates a cross-section view of the transfer head in FIG. 22 along a B-B direction, consistent with various disclosed embodiments in the present disclosure.

FIG. 22 illustrates a structure of another transfer head consistent with various disclosed embodiments in the present disclosure; and FIG. 23 illustrates a cross-section view of the transfer head in FIG. 20 along a B-B direction. A second through hole may be formed on the bottom of the second groove 12. The transfer head 10 may further include a second fixing block 15. The second fixing block 15 may enter the second groove 12 via the second through hole and may move along a depth direction of the second groove 12. In the transfer head provided by this embodiment, the second fixing block can move along a depth direction of the second groove. When the inorganic light-emitting diode to be transferred enters the second groove of the transfer head, the second fixing block may enter the interior of the second groove, so the inorganic light-emitting diode can be pressed and cannot move along a depth direction of the second groove.

In various embodiments, the first fixing block and the second fixing block may be moved through an electrical magnet structure or a spring structure.

Figure 24:
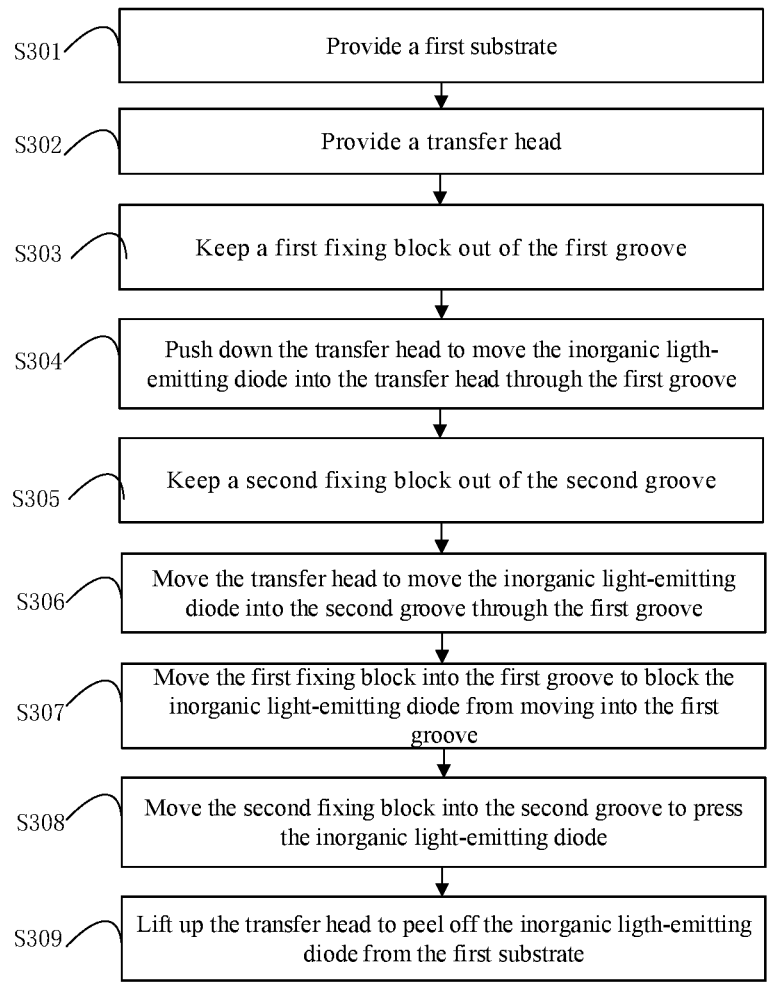
FIG. 24 illustrates a flowchart for an exemplary method for transferring an inorganic light-emitting diode consistent with various disclosed embodiments in the present disclosure.
Figure 25:
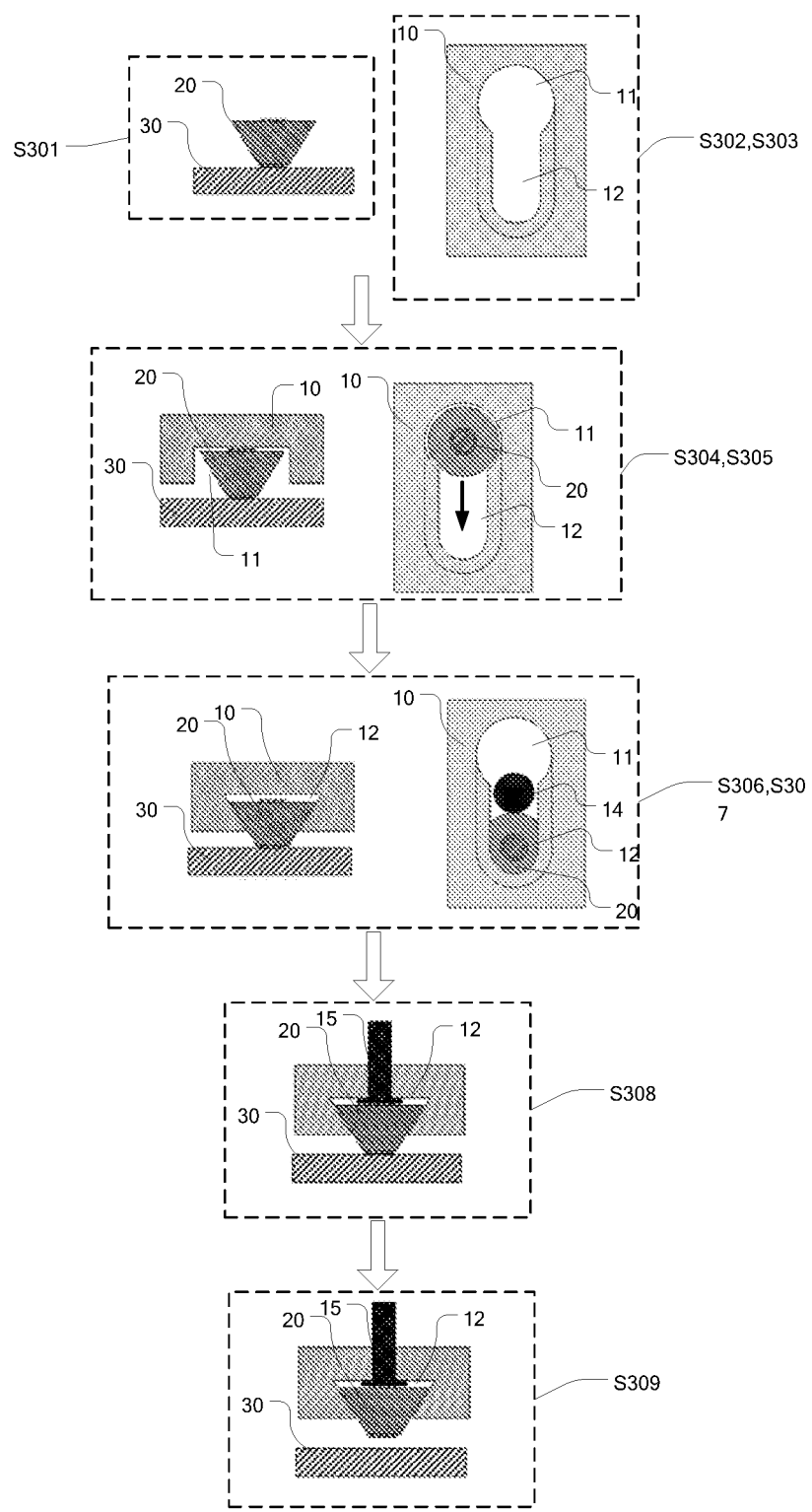
FIG. 25 illustrates structures of an exemplary transfer head corresponding to different steps for an exemplary method for transferring an inorganic light-emitting diode consistent with various disclosed embodiments in the present disclosure.

The inorganic light-emitting diode 20 may be picked up using the transfer head 10 provided by the transfer head 10 illustrated in FIG. 20 and FIG. 21. FIG. 24 illustrates a flowchart for a method for transferring an inorganic light-emitting diode consistent with various disclosed embodiments in the present disclosure, and FIG. 25 illustrates structures of the transfer head corresponding to different steps for the method in FIG. 24. The method for transferring the inorganic light-emitting diode 20 may include Steps S301 to S309 in FIG. 24 described in detail below. A part of the steps in the method in FIG. 24 may be as same as the method in FIG. 8.

Step S301: a first substrate 30 may be provided.

Step S302: the transfer head 10 including the first fixing block 14 and the second fixing block 15 may be provided. The structure of the transfer head 10 may be referred to the previous description about the transfer head.

Step S303: the first fixing block 14 may be kept out of the first groove 11.

Step S304: the transfer head 10 may be pushed down to move the inorganic light-emitting diode 20 into the transfer head 10 through first groove 11.

When pushing the transfer head 10 down, the first fixing block 14 may be kept out of the first groove 11 to avoid blocking the inorganic light-emitting diode 20 from entering the transfer head 10.

Step S305: the second fixing block 15 may be kept out of the second groove 12.

Step S306: the transfer head 10 may be moved, to make the inorganic light-emitting diode 20 moving from the first groove 11 to the second groove 12.

Before the inorganic light-emitting diode 20 moves from the first groove 11 to the second groove 12, the second fixing block 15 may be kept out of the second groove 12 to avoid blocking the inorganic light-emitting diode 20 from entering the second groove 12 through the first groove 11.

In various embodiments, the Step S305 can be anywhere before the Step S306. In one embodiment, the Step S305 may be before the Step S304.

Step S307: the first fixing block 14 may enter the first groove 11 to block the moving of the inorganic light-emitting diode 20 from the second groove 12 to the first groove 11.

Step S308: the second fixing block 15 may enter the second groove 12 to press the inorganic light-emitting diode 20.

In Step S307, after the inorganic light-emitting diode 20 moves from the first groove 11 to the second groove 12, the first fixing block 14 may enter the first groove 11, to block the moving of the inorganic light-emitting diode 20 from the second groove 12 to the first groove 11. The inorganic light-emitting diode 20 may be confined in a lateral direction (the first direction). In Step S308, the second fixing block 15 may enter the second groove 12, and to block the moving of the inorganic light-emitting diode 20 toward the bottom of the second groove 12. The inorganic light-emitting diode 20 may be confined in a longitudinal direction (the depth direction of the second groove 12).

Step S309: the transfer head 10 may be lifted up to peel the inorganic light-emitting diode 20 off from the first substrate 30.

In this step, when peeling the inorganic light-emitting diode 20 off from the first substrate 30, because of the confining function of the first fixing block 14, the second fixing block 15, and the second groove 12, the inorganic light-emitting diode 20 may be fixed in the transfer head 10 and cannot move relative to the transfer head 10. A success rate of picking up the inorganic light-emitting diode may be improved.

In some embodiments, a release layer may be formed between the inorganic light-emitting diode 20 and the first substrate 30. After moving the transfer head 10 to move the inorganic light-emitting diode 20 from the first groove 11 to the second groove 12 but before lifting up the transfer head 10, the release layer may be peel off from the inorganic light-emitting diode 20. Correspondingly, when lifting up the transfer head 10, the inorganic light-emitting diode 20 may be peeled off from the first substrate 30 using a relatively small force. In one embodiment, the release layer may be made of (Ga, In)AsN. Correspondingly, the release layer may be removed from the inorganic light-emitting diode 20 by a laser radiation method, and a process for removing the release layer may be simplified.

The present disclosure was described by using a transfer head including a first fixing block and a second fixing block simultaneously as an example for description purposes only. This should not limit the scope of the present disclosure, and the transfer head may only include a first fixing block or a second fixing block. Correspondingly, the method for transferring the inorganic light-emitting diode may only include steps related to the first fixing block or related to the second fixing block. The following description is similar.

Figure 26:
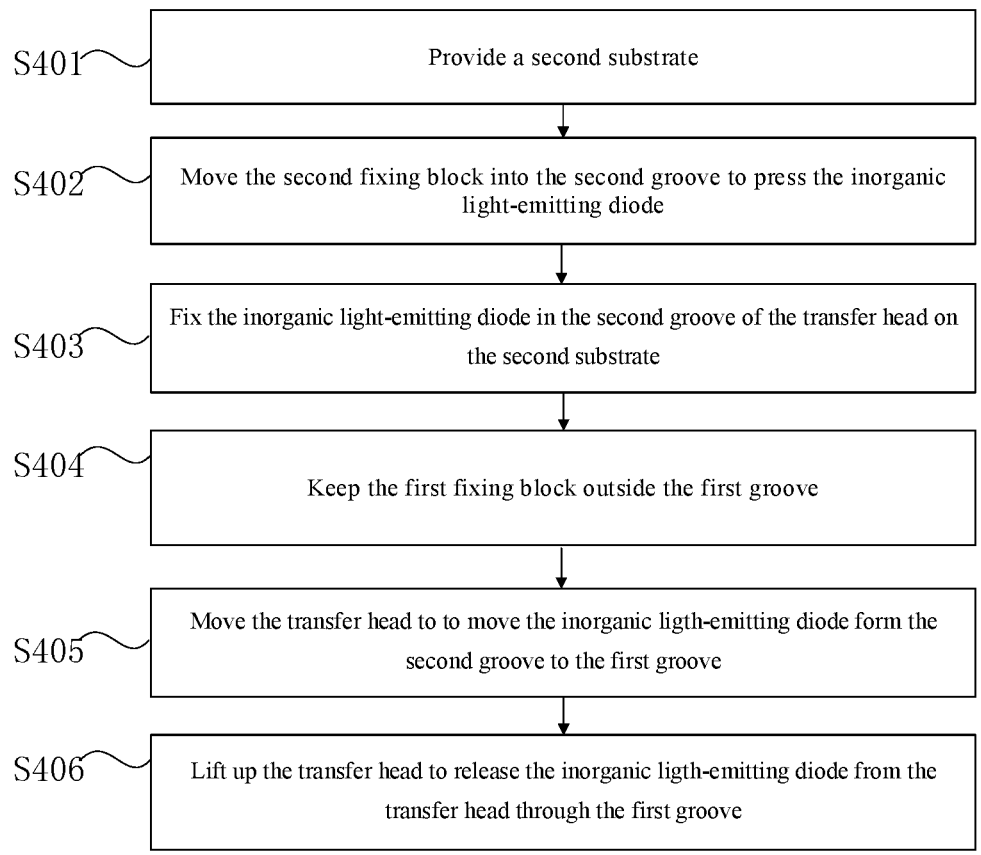
FIG. 26 illustrates a flowchart for an exemplary method for transferring an inorganic light-emitting diode consistent with various disclosed embodiments in the present disclosure.
Figure 27:
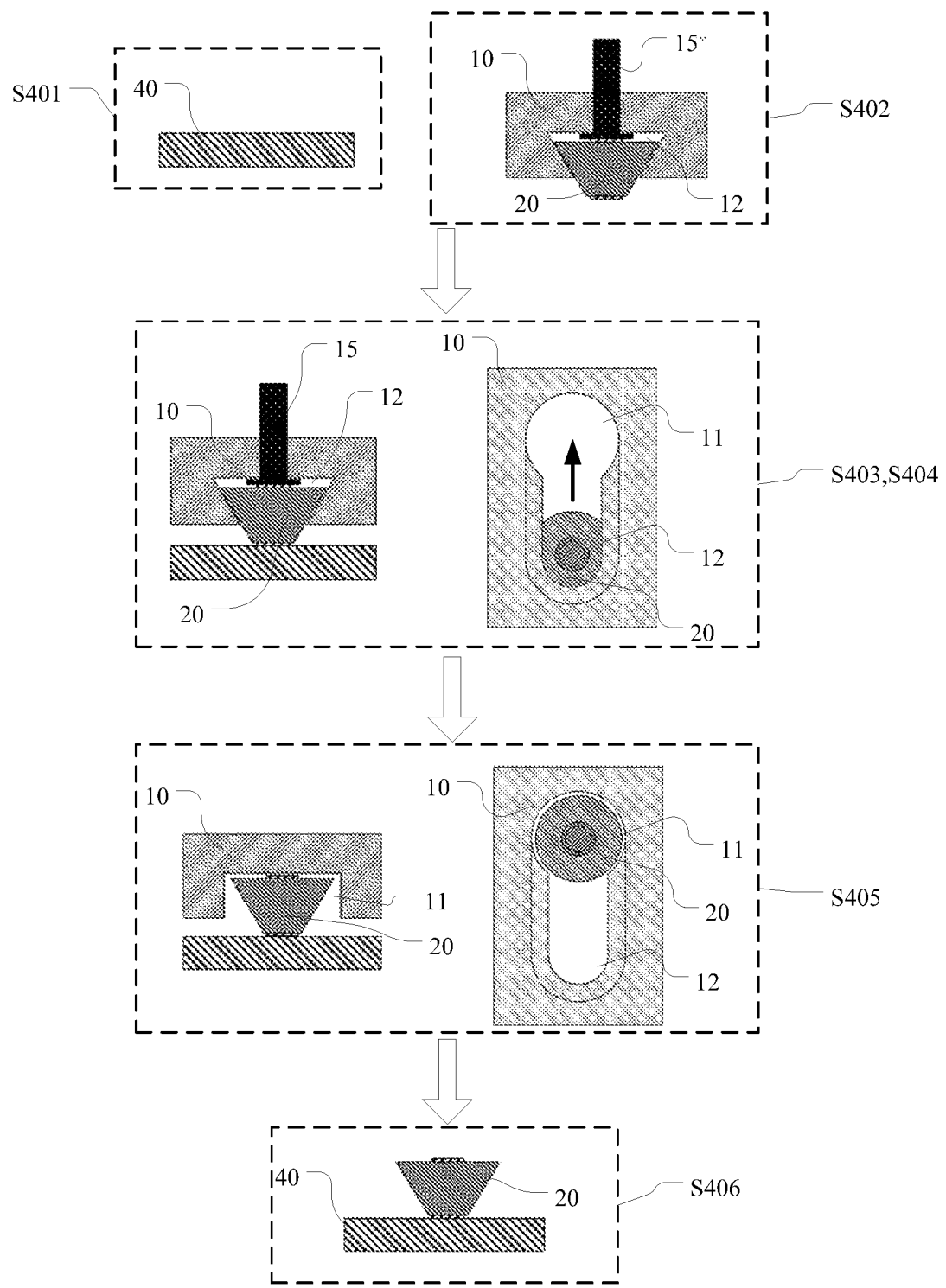
FIG. 27 illustrates structures of an exemplary transfer head corresponding to different steps for an exemplary method for transferring an inorganic light-emitting diode consistent with various disclosed embodiments in the present disclosure.

The transfer head consistent with the embodiments of the present disclosure illustrated in FIGS. 20-21 may also be used to release the inorganic light-emitting diode on an array substrate or other substrate requiring the inorganic light-emitting diode. FIG. 26 illustrates a flow chart for another method for transferring an inorganic light-emitting diode consistent with various disclosed embodiments in the present disclosure; and FIG. 27 illustrates structures of the transfer head corresponding to different steps for the method in FIG. 26. The method for transferring the inorganic light-emitting diode 20 may include Steps S401 to S406 in FIG. 26 described in detail below. A part of the steps in the method in FIG. 26 may be as same as the method in FIG. 10.

Step S401: a second substrate 40 may be provided.

Step S402: the second fixing block 15 may be moved into the second groove 12 to press the inorganic light-emitting diode 20.

Step S403: the inorganic light-emitting diode 20 in the second groove 12 of the transfer head 10 may be fixed on the second substrate 40.

Before fixing the inorganic light-emitting diode 20 in the second groove 12 of the transfer head 10 on the second substrate 40, the second fixing block 15 may be moved into the second groove 12 to press the inorganic light-emitting diode 20. Correspondingly the inorganic light-emitting diode 20 may be pushed toward the notch of the second groove 12 as much as possible, to make the inorganic light-emitting diode 20 protruding out of the second groove 12 as much as possible. The inorganic light-emitting diode 20 in the second groove 12 of the transfer head 10 may be fixed on the second substrate 40 easily.

Step S404: the first fixing block 14 may be kept out of the first groove 11;

Step S405: the transfer head 10 may be moved, to make the inorganic light-emitting diode 20 moving from the second groove 12 to the first groove 11.

Before moving the inorganic light-emitting diode 20 from the second groove 12 to the first groove 11, the first fixing block 14 may be kept out of the first groove 11, to avoid blocking the transfer of the inorganic light-emitting diode 20 from the second groove 12 to the first groove 11 by the first block 14.

Step S406: the transfer head 10 may be lifted up so the inorganic light-emitting diode 20 may exit the transfer head through the first groove 11.

In one embodiment, a soldering part may be formed on an end of the inorganic light-emitting diode 20 away from the bottom of the second groove 12. The soldering part may stick out of the second groove 12. A connection electrode may be formed at a position corresponding to the inorganic light-emitting diode 20 in the second substrate 40. When fixing the inorganic light-emitting diode 20 on the second substrate 40, the soldering part of the inorganic light-emitting diode 20 may be fixed on and connected to the connection electrode of the second substrate 40. Correspondingly, a fixation between the inorganic light-emitting diode 20 on the second substrate 40, and a connection between the inorganic light-emitting diode 20 on the corresponding structure on the second substrate 40, may be achieved simultaneously. For example, the second substrate 40 may be an array substrate of the display panel, and the corresponding electrode described above in the array substrate may be an anode. The inorganic light-emitting diode 20 may include a p-type expansion layer, an n-type expansion layer, and a quantum well layer between the p-type expansion layer and the n-type expansion layer. The soldering part may be deployed on a side with the p-type expansion layer of the inorganic light-emitting diode 20 and may be connected to the p-type expansion layer. When fixing the inorganic light-emitting diode 20 on the second substrate 40, the soldering part may be fixed on/connected to the anode in the second substrate 40. A cathode may be formed on a side with the n-type expansion layer of the inorganic light-emitting diode 20. The inorganic light-emitting diode 20 may emit light to display images when a voltage is applied between the anode and the cathode.

In one embodiment, the soldering part may be made of at least one of indium and tin. When the soldering part of the inorganic light-emitting diode 20 is fixed on and connected to the connection electrode of the second substrate 40, the soldering part may be placed on a position corresponding to the connection electrode and contact the electrode firstly. Then the soldering part may be melted by heating. The melted soldering part may be fixed with the electrode, and may form an electrical connection between the inorganic light-emitting diode 20 and the second substrate 40 simultaneously.

In the transfer head and the method for transferring the inorganic light-emitting diode using the transfer head provided by various embodiments of the present disclosure, the transfer head may use a physical structure to pick up and to release the inorganic light-emitting diode, and may have a simple structure. Compared to the transfer heads using complex electrical or magnetic structures, a difficulty in the process for forming the transfer head provided by various embodiments of the present disclosure may be reduced and a cost for the transfer head may be reduced too. When transferring the inorganic light-emitting diode using the transfer head provided by the present disclosure, it is not easy to damage the transfer head during the transferring process, and a success rate of picking up and releasing the inorganic light-emitting diode may be improved. Moreover, using a transfer head array including a plurality of transfer heads provided by the present disclosure, a plurality of inorganic light-emitting diodes may be transferred in the same time. A simple and reliable method for a massive transfer of the inorganic light-emitting diodes is provided.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A transfer head, for transferring an inorganic light-emitting diode, the transfer head comprising a first groove and a second groove, wherein:
the first groove and the second groove are disposed sequentially in a first direction;
the first groove and the second groove are connected to each other;
the first groove is configured to provide an inlet/outlet for the inorganic light-emitting diode to enter and exit the transfer head; and
after the inorganic light-emitting diode enters the second groove through the first groove, at least a partial structure of the inorganic light-emitting diode is confined in the second groove.

2. The transfer head according to claim 1, wherein:
a minimum distance between two opposite inner sidewalls of the first groove along a second direction perpendicular to the first direction is a first distance of the first groove;

the inorganic light-emitting diode has a multi-layer stacking structure;
a third direction is perpendicular to a stacking direction of the multi-layer stacking structure;
a maximum distance between two opposite outer sidewalls of the inorganic light-emitting diode along the third direction is a second distance of the inorganic light-emitting diode; and
the first distance of the first groove is larger than the second distance of the inorganic light-emitting diode.

3. The transfer head according to claim 2, wherein:
a first cross section of the first groove is in parallel with the first direction and the second direction;
a second cross section of the inorganic light-emitting diode is perpendicular to the stacking direction of the multi-layer stacking structure; and
the first cross section of the first groove has a shape substantially same as a shape of the second cross section of the inorganic light-emitting diode.

4. The transfer head according to claim 3, wherein:
both the first cross section and the second cross section are circles or regular polygons.

5. The transfer head according to claim 2, wherein:
a minimum distance between two opposite inner sidewalls of the second groove along the second direction is a third distance of the second groove;
the third distance of the second groove is smaller than the second distance; and
a distance between a position of the second groove at the third distance and a bottom of the second groove is larger than 0.

6. The transfer head according to claim 5, wherein:
a third cross section of the second groove is perpendicular to the first direction;
the third cross section of the second groove is a trapezoid;
the trapezoid has two opposite parallel sides, including a long side and a short side; and
the long side of the trapezoid corresponds to the bottom of the second groove.

7. The transfer head according to claim 6, wherein:
a fourth cross section of the first groove is perpendicular to the first direction;
the fourth cross section is a rectangle; and
the fourth cross section along the second direction has a width substantially same as the long side of the trapezoid of the third cross section of the second groove.

8. The transfer head according to claim 5, wherein:
a third cross section of the second groove perpendicular to the first direction is a rectangle; and
protrusions are respectively formed on two opposite inner sidewalls of the second groove along the second direction; and
the third distance of the second groove is a distance between the protrusions of the second groove.

9. The transfer head according to claim 8, wherein:
the third distance between the protrusions on the two opposite inner sidewalls of the second groove is adjustable.

10. A transfer head according to claim 1, wherein:
a minimum distance between two opposite inner sidewalls of the second groove along a second direction perpendicular to the first direction is a third distance of the second groove;
the inorganic light-emitting diode has a multi-layer stacking structure;
a third direction is perpendicular to a stacking direction of the multi-layer stacking structure;

a minimum distance between two opposite outer sidewalls of the inorganic light-emitting diode along the third direction is a fourth distance; and the third distance of the second groove is larger than the fourth distance of the inorganic light-emitting diode.

11. The transfer head according to claim 1, wherein:

a first through hole is formed in a bottom of the first groove adjacent to the second groove;

the transfer head further includes a first fixing block; and the first fixing block is configured to enter the first groove via the first through hole and is movable along a depth direction of the first groove.

12. The transfer head according to claim 1, wherein:

a second through hole is formed in a bottom of the second groove;

the transfer head further includes a second fixing block; and the second fixing block is configured to enter the second groove via the second through hole and is movable along a depth direction of the second groove.

13. A transfer head array comprising a plurality of transfer heads arranged in an array, wherein each of the plurality of transfer heads includes the transfer head according to claim 1.

* * * * *